United States Patent [19]

Kokkas

[11] Patent Number: 4,672,314

[45] Date of Patent: Jun. 9, 1987

[54] COMPREHENSIVE SEMICONDUCTOR TEST STRUCTURE

[75] Inventor: Achilles G. Kokkas, West Windsor Township, Mercer County, N.J.

[73] Assignee: RCA Corporation, Princeton, N.J.

[21] Appl. No.: 722,371

[22] Filed: Apr. 12, 1985

[51] Int. Cl.$^4$ ............................................. G01R 31/26
[52] U.S. Cl. ................... 324/158 R; 29/574; 324/64; 324/65 R; 430/30
[58] Field of Search ............ 324/158 R, 62, 64, 65 R; 29/574; 430/30

[56] References Cited

U.S. PATENT DOCUMENTS

| | | | |
|---|---|---|---|
| 3,808,527 | 4/1974 | Thomas | 324/65 R |
| 3,974,443 | 8/1976 | Thomas | 324/158 R X |
| 4,100,486 | 7/1978 | Casowitz et al. | 324/62 |
| 4,144,493 | 3/1979 | Lee et al. | 324/158 R |
| 4,347,479 | 8/1982 | Cullet | 324/64 |
| 4,399,205 | 8/1983 | Bergendahl | 430/30 |
| 4,516,071 | 5/1985 | Buehler | 324/158 R |

FOREIGN PATENT DOCUMENTS 215177 10/1984 German Democratic Rep. ... 324/73 R

OTHER PUBLICATIONS

Hubacher et al., "Detecting Defects in Integrated Semiconductor Circuits", IBM Technical Disclosure Bulletin, vol. 14, No. 9, Feb. 1972, pp. 2615-2617.
"A Direct Measurement of Interfacial Contact Resistance", S. J. Proctor et al., IEEE Electron Device Letters, vol. EDL-3, No. 10, Oct. 1982, pp. 294-296.
"Contact Resistance: Al and Al-Si to Diffused N+ and P+ Silicon", T. J. Faith et al., J. Vac. Sci. Technol., vol. 1, No. 2, Apr.-Jun. 1983, pp. 443-448.
"Semiconductors and Semimetals", Applications and Devices Part A, vol. 7, p. 178 ff, Edited by R. K. Willardson and A. C. Beer, (Academic Press, New York, 1971).

Primary Examiner—Reinhard J. Eisenzopf
Assistant Examiner—Stephen M. Baker
Attorney, Agent, or Firm—Birgit E. Morris; Donald S. Cohen; Kenneth R. Glick

[57] ABSTRACT

A structure for measuring electrical and physical characteristics of a semiconductor region includes a semiconductor region having a first portion of width $W_1$ and a second portion of width $W_2$, wherein $W_1$ is not equal to $W_2$. First, second, third and fourth contact areas to the semiconductor region are disposed in seriatim such that the second portion of the semiconductor region extends between the third and fourth contact areas. A bonding pad is electrically connected to each of the contact areas for supplying current to predetermined pairs of the contact areas and for measuring the voltage across predetermined pairs of the contact areas.

6 Claims, 2 Drawing Figures

COMPREHENSIVE SEMICONDUCTOR TEST STRUCTURE

The present invention relates to a test structure which is incorporated on a semiconductor wafer. More particularly, the invention relates to a single structure which permits the measurement of sheet resistance, contact resistance and line width and makes efficient use of wafer surface area.

BACKGROUND OF THE INVENTION

In the solid state semiconductor device art a variety of electronic components may be formed both within and on the surface of a semiconductor wafer. For example, resistors, diodes, transistors and thyristors may be fabricated and interconnected to form an integrated circuit by processing that includes appropriately doping various portions of the wafer. Additionally, a variety of differently structured conductor lines, resistors and capacitors may be formed on the surface of each device on the wafer. Due to the large number of processing steps and wide range of processing variables encountered during the fabrication of a conventional device, it has become a practical necessity to incorporate a variety of test structures on the wafer, to facilitate both the monitoring of the process and the testing of completed wafers.

In a conventional configuration, a plurality of test structures are used. For example, for each differently doped region on a device there is typically one test structure for measuring sheet resistance and one or two test structures for measuring line width. Each sheet resistance test structure typically includes four electrode contacts and four bond pads and the line width test structure(s) typically includes at least three additional electrode contacts and at least three more bond pads. For semiconductor device regions which are to be contacted by metallization on the wafer surface, there is additionally usually a similarly doped test structure for measuring contact resistance that may incorporate still additional electrode contacts and bond pads.

In a conventional semiconductor device manufacturing process, a rectangular array of devices, commonly referred to as chips, is formed on the surface of a semiconductor wafer, and the test structures are formed in what are termed knockout areas, i.e., areas which would otherwise be devices. As device structures become more complicated, it becomes necessary to incorporate a greater number of test structures within each knockout area. However, as the number of test structures is increased, the constraint imposed by the area of the knockout becomes a significant limitation and can ultimately reduce the number of measurable device parameters. In an effort to increase the amount of information which can be gleaned from a test structure of a given area, the present invention was conceived.

SUMMARY OF THE INVENTION

A structure for measuring electrical and physical characteristics of a semiconductor region includes a semiconductor region having a first portion of width $W_1$ and a second portion of width $W_2$, wherein $W_1$ is not equal to $W_2$. First, second, third and fourth contact areas to the semiconductor region are disposed in seriatim such that the second portion of the semiconductor region extends between the third and fourth contact areas. A bonding pad is electrically connected to each of the contact areas so as to provide means for supplying current to predetermined pairs of contact areas and means for measuring the voltage across predetermined pairs of contact areas.

DETAILED DESCRIPTION OF PREFERRED EMBODIMENT

Figure 1:
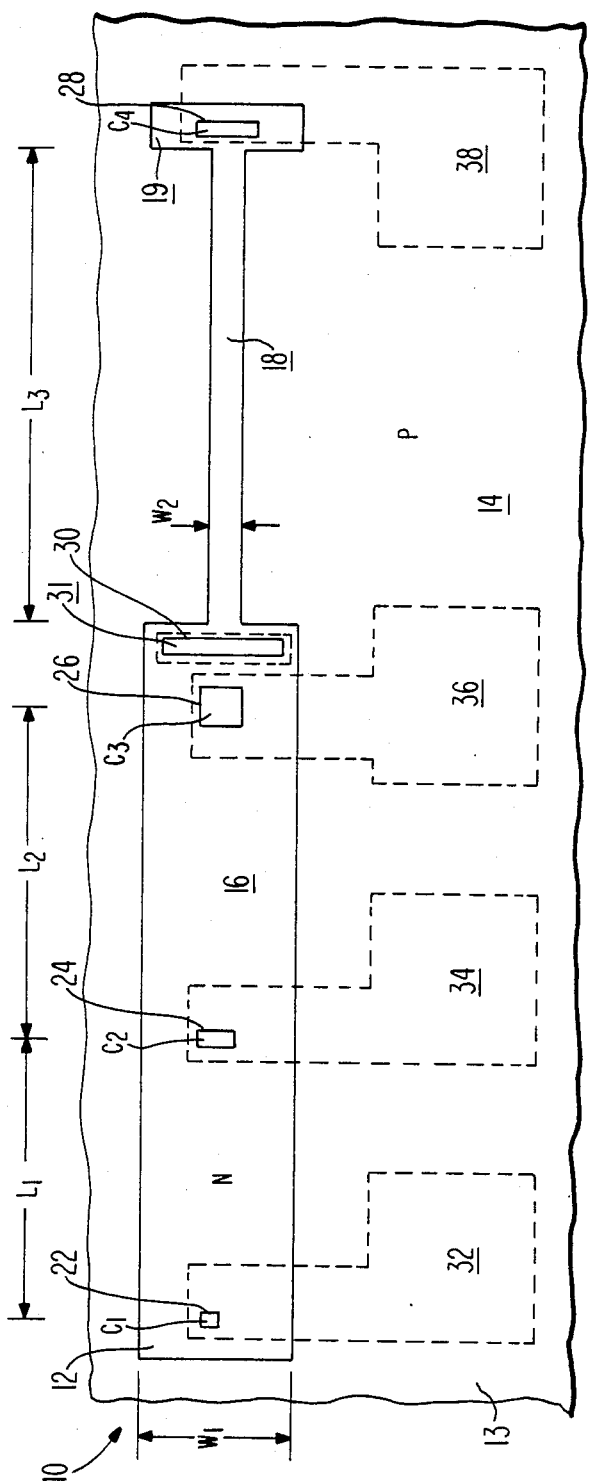
FIG. 1 is a plan view of the configuration of the comprehensive test structure of the present invention.

As illustrated in FIG. 1, the comprehensive test structure 10 provides a means for testing the sheet resistance, contact resistance, and line width of an N type monocrystalline semiconductor region 12. However, as will be elaborated upon herein, the structure of the present invention is equally suitable to testing other conductive materials such as P type material, polycrystalline material and silicides. The N type region 12 extends into semiconductor wafer 13 from a major surface 14 thereof and is surrounded by P type semiconductor material.

The semiconductor region 12 has a first portion of width $W_1$ and a second portion of width $W_2$, wherein $W_1$ is not equal to $W_2$. In the preferred embodiment the comprehensive test structure 10 has the geometric configuration of an elongated strip which comprises essentially two rectangular portions. The first of said rectangular portions, as identified at 16, has a width $W_1$. The second rectangular portion, as identified at 18, has a a width $W_2$ which is different from the width $W_1$. In the preferred embodiment $W_2$ is less than approximately one-half the width $W_1$ and the second rectangular portion 18 has a length $L_3$. Convenient values for $W_1$, $W_2$ and $L_3$ are determined by the design rules applied to the devices on the wafer on which the test structure 10 is located. For example, when the semiconductor devices incorporate what is commonly referred to as two micron technology, i.e., a 2 micron minimum photolithographic feature size, $W_2$ would preferably be approximately 2–4 microns and $W_1$ would be approximately 4 to 40 microns. $L_3$ should preferably be greater than $W_1$ and $W_2$, and might conveniently be approximately 100–200 microns.

The first and second rectangular portions 16 and 18 are contiguous and are oriented such that the length dimension of each is similarly oriented. The structure 10 additionally includes a third portion, hereinafter contact portion 19, contiguous with the second rectangular portion 18 and disposed on the end thereof which is opposite to the first rectangular portion 16. The contact portion 19 is wider than $W_2$ and is provided merely to facilitate electrical connection to the end of the second rectangular portion 18 when the width $W_2$ is relatively narrow. The width of contact portion 19 may be less than or equal to $W_2$ if $W_2$ is sufficiently wide.

Overlying the N type region 12 as well as the P type region adjacent thereto are one or more layers of insulation through which there are contact openings 22, 24, 26 and 28 to the N type region 12. In the preferred embodiment, each of the contact openings is of a different size. The contact openings are disposed in seriatim along the length of the N type region 12 and are located such that contact openings 22, 24 and 26 extend to the first rectangular portion 16 and contact opening 28 extends to the contact portion 19. That is, three of the four contacts are disposed on the first rectangular portion 16, and the second rectangular portion 18 is disposed between the third and fourth contacts.

In the preferred embodiment, where $W_1$ is greater than $W_2$, there is additionally a fifth, elongated opening 30 through the insulation which is located over the first rectangular portion 16 between the third contact opening 26 and the second rectangular portion 18. The elongated opening 30 is substantially rectangular in shape, has a length which is less than but almost equal to $W_1$, and is oriented such that its length is parallel to the width of the first rectangular portion 16.

Overlying the insulation is a set of bond pads, which in the preferred embodiment are metal. As shown by the dashed lines in FIG. 1, bond pads 32, 34, 36 and 38 contact the N type region 12 via the contact openings 22, 24, 26 and 28, respectively, to form a series of contact areas $C_1$, $C_2$, $C_3$ and $C_4$, respectively. The spacing between $C_1$ and $C_2$ is identified as $L_1$ and the spacing between $C_2$ and $C_3$ is identified as $L_2$. The values of $L_1$ and $L_2$ are not particularly constrained although they are preferrably greater than $W_1$ and $W_2$. Conveniently, $L_1$ and $L_2$ will be in the same range as $L_3$. The same metal which forms the bond pads independently contacts the first rectangular portion 16 through the elongated opening 30 so as to form a shorting bar 31. During operation of the test structure 10, the shorting bar 31 serves to create a more uniform current flow between $C_1$ and $C_3$ than would occur if the bar were absent.

The comprehensive test structure 10 is fabricated simultaneously with the semiconductor devices that are located on the wafer such that the parameters measured for the test structure will be equivalent to the parameters for similarly processed regions of the devices. The processing sequence used to fabricate the N type region 12 should be the same as the processing sequence used to fabricate equivalent N type regions which are present on the devices. The N type region 12 should be exposed to the same photolithographic processing and impurity doping. In addition to the width $W_1$ or the width $W_2$ being approximately similar to line widths on the devices, the configuration and areas of the contact openings 22, 24, 26 28 should correspond to the configurations and areas of contact openings on the devices.

The illustrated comprehensive test structure 10 can be used, for example, to evaluate an N+ type conductivity source and drain region diffusion of an N channel field effect transistor (FET) such as a metal oxide semiconductor FET (MOSFET). For a P channel MOSFET on the same wafer, as in a complementary symmetry MOSFET (CMOS FET), the structure of the present invention can be used to evaluate the P+ type source and drain diffusion by locating a P+ type region 12 within an N type well in a manner similar to the placement of the P+ type source and drain regions within an N type well. The region 12 of the test structure 10 might also comprise a region of polycrystalline silicon on the surface of the semiconductor wafer. Doped polycrystalline silicon is frequently used on MOSFETs, for example, as gate electrode material and as an interconnection means among various portions of the device.

A series of comprehensive test structures 10 of the present invention can readily be interconnected as well. For example, a test structure 10 with an N type region 12 may be placed adjacent to a structure with a P type region 12 within an N type well and adjacent to a polycrystalline silicon region 12. In such an interconnected structure, certain of the contact areas on each of the individual structures may be interconnected so as to further reduce the number of bond pads which are necessary. Furthermore, the three test structures 10 within such an interconnected structure might be oriented so as to form a single row or multiple rows.

Figure 2:
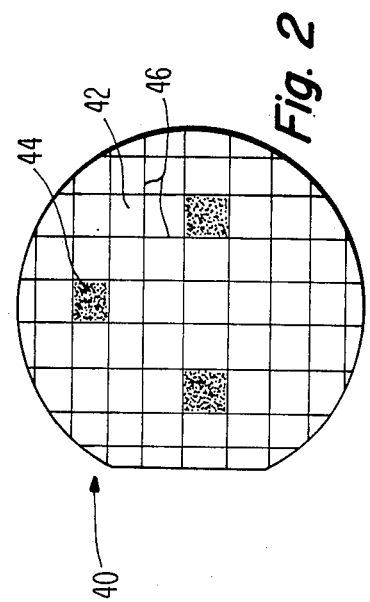
FIG. 2 is a plan view of a semiconductor wafer which illustrates where the test structure of the present invention may be located.

Possible locations for the comprehensive test structure(s) 10 are shown in the plan view of a semiconductor wafer 40 in FIG. 2. A conventional configuration is illustrated, wherein the wafer surface is divided into a two-dimensional array of substantially rectangular devices 42. Knockout areas 44 are provided in one or more locations where devices would normally occur, and test structures 10 can appropriately be located in these knockout areas 44. Alternatively, the elongated configuration of the test structure 10 lends itself to being located along the boundaries 46 between devices. These boundaries 46, commonly referred to as streets, define the lines along which the individual devices 42 will ultimately be separated.

The invention is utilized by selectively applying a current of magnitude $I_{ab}$ between the pair of contact areas $C_a$ and $C_b$, where a and b are two integers between 1 and 4 inclusively, and measuring a voltage of magnitude $V_{ij}$ between the pair of contact areas $C_i$ and $C_j$, where i and j are two integers between 1 and 4 inclusively. By using the measured $I_{ab}$ and $V_{ij}$ values one can mathematically determine sheet resistance, contact resistance and deviation from nominal line width on the test structure 10. The nomenclature is defined as follows:

$W_{N1}$ ≡ the nominal design width, e.g. a mask dimension, of the first rectangular portion 16;

$W_{N2}$ ≡ the nominal design width of the second rectangular portion 18;

$\Delta W$ ≡ the difference between either of the nominal widths and the actual width (i.e., $\Delta W = W_{N1} - W_1 = W_{N2} - W_2$);

$\rho_s$ ≡ sheet resistance of the semiconductor region 12; and $R_{Cx}$ ≡ the contact resistance at the contact area $C_x$.

The equations which follow represent excellent approximations to actual contact resistances, sheet resistances and line width deviations on the test structure 10. As one skilled in the art will recognize, however, there is some error due to spreading resistance and current crowding effects in the vicinity of the contact areas $C_1$, $C_2$, $C_3$ and $C_4$, in the vicinity of the transition between the first rectangular portion 16 and the second rectangular portion 18, and in the vicinity of the transition between the second rectangular portion 18 and contact portion 19. For example, there is some error introduced by the finite size of the contact areas $C_1$, $C_2$, $C_3$ and $C_4$ and by the distances that $C_3$ and $C_4$ are disposed from the ends of the second rectangular portion 18.

In the illustrated test structure 10, the contact resistance $R_{C1}$ can be determined by the Shockley technique, as described in "Semiconductors and Semimetals," *Applications and Devices Part A*, Vol. 7, pp. 178 edited by R. K. Willardson and A. C. Beer, (Academic Press, New York, 1971).

In the preferred embodiment, the contact area $C_4$ is of a large enough size so that the associated contact resistance $R_{C4}$ is negligible. Alternatively, $C_4$ may be made equal to $C_1$, $C_2$, or $C_3$ so that $R_{C4}$ is equal to $R_{C1}$, or $R_{C2}$ or $R_{C3}$.

The contact resistances $R_{C2}$ and $R_{C3}$ can be determined by a technique which is elaborated upon in "Contact resistance: Al and Al-Si to diffused N+ and P+ silicon", T. J. Faith, et al., J. Vac. Sci. Technol., Volume 1, No. 2, Apr.-June 1983, pp. 443-448, and which I summarize as follows:

where x, y and z are integers between 1 and 4 inclusively, and
y>x>z or y<x<z, and
x=2 or 3, $R_{Cx} = (V_{xy}/I_{zx})$ For example:

$R_{C2} = (V_{24}/I_{12})$
and
$R_{C3} = (V_{34}/I_{13})$

Sheet resistance $\rho_s$ may be calculated as follows:
where w, x, y and z are integers between 1 and 4 inclusively, and
w≠x≠y≠z, and
3<x+y<7, $$\rho_s = \frac{V_{xy}}{I_{zw}} \left( \frac{W_{N1} - \Delta W}{L_2} \right)$$

For example:

$$\rho_s = \frac{V_{23}}{I_{14}} \left( \frac{W_{N1} - \Delta W}{L_2} \right)$$

To determine line width deviation $\Delta W$ one may, for example, apply current $I_{14}$ and measure $V_{34}$. This will yield:

$$\frac{V_{34}}{I_{14}} = R_{C4} + \rho_s \left( \frac{L_3}{W_{N2} - \Delta W} \right)$$

Substituting for $\rho_2$, for example, when x=2, y=3, z=1 and w=4, yields:

$$\frac{V_{34}}{I_{14}} = R_{C4} + \frac{V_{23}}{I_{14}} \left( \frac{W_{N1} - \Delta W}{L_2} \right) \left( \frac{L_3}{W_{N2} - \Delta W} \right)$$

Solving for $\Delta W$ yields:

$$\text{and } \Delta W = \frac{W_{N1} - \left( \frac{V_{34} - R_{C4}I_{14}}{V_{23}} \right) \left( \frac{L_2}{L_3} \right) W_{N2}}{1 - \left( \frac{V_{34} - R_{C4}I_{14}}{V_{23}} \right) \left( \frac{L_2}{L_3} \right)}$$

Thus, by selectively applying current across predetermined pairs of bonding pads and measuring the voltage across other pairs of bonding pads (although the two pairs may have one or more pads in common), the test structure 10 will yield three contact resistance values, a sheet resistance value, and a measure of line width deviation $\Delta W$. Furthermore, one skilled in the art will recognize that a variety of calculations, other than those illustrated, may be used to determine these values.

What is claimed is:

1. A structure for measuring electrical and physical characteristics of a semiconductor region, comprising:
   a semiconductor region having a first portion of width $W_1$ in series with a second portion of width $W_2$, wherein $W_1$ is not equal to $W_2$;
   first, second, third and fourth contact areas to said semiconductor region, said four contact areas being disposed in seriatim such that the first, second and third contact areas are disposed on the first semiconductor portion and said second portion of the semiconductor region extends between the third and fourth contact areas; and
   a bonding pad electrically connected to each contact area so as to provide means for supplying current to predetermined pairs of said contact areas and means for measuring voltage across predetermined pairs of said contact areas.

2. A structure in accordance with claim 1 wherein said first and second portions of the semiconductor region are rectangular in shape.

3. A structure in accordance with claim 1 wherein $W_1$ is greater than $W_2$.

4. A structure in accordance with claim 1 wherein said semiconductor region comprises a material selected from the group consisting of polycrystalline silicon, silicide, N type monocrystalline silicon, and P type monocrystalline silicon.

5. A structure in accordance with claim 1 wherein said four contact areas are of different sizes.

6. A structure in accordance with claim 1 further comprising a conductive, substantially rectangular shorting bar disposed on the first portion of the semiconductor region at a location adjacent to the second portion.

* * * * *